(12) United States Patent
Kirby et al.

(10) Patent No.: US 12,107,050 B2
(45) Date of Patent: Oct. 1, 2024

(54) FRONT END OF LINE INTERCONNECT STRUCTURES AND ASSOCIATED SYSTEMS AND METHODS

(71) Applicant: Micron Technology, Inc., Boise, ID (US)

(72) Inventors: Kyle K. Kirby, Eagle, ID (US); Kunal R. Parekh, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 186 days.

(21) Appl. No.: 17/325,090

(22) Filed: May 19, 2021

(65) Prior Publication Data

US 2022/0068820 A1 Mar. 3, 2022

Related U.S. Application Data

(60) Provisional application No. 63/071,983, filed on Aug. 28, 2020.

(51) Int. Cl.
*H01L 23/538* (2006.01)
*H01L 21/50* (2006.01)
(Continued)

(52) U.S. Cl.
CPC .......... *H01L 23/5384* (2013.01); *H01L 21/50* (2013.01); *H01L 21/76802* (2013.01);
(Continued)

(58) Field of Classification Search
CPC ............. H01L 23/5384; H01L 23/5386; H01L 21/76802; H01L 21/76877; H01L 27/0688; H01L 27/092; H01L 25/0657; H01L 25/18
See application file for complete search history.

(56) References Cited

U.S. PATENT DOCUMENTS 10,199,326 B1 * 2/2019 Ohsaki ................... H10B 43/20
10,354,980 B1 7/2019 Mushiga et al.
(Continued)

OTHER PUBLICATIONS

International Search Report and Written Opinion mailed on Feb. 22, 2022 for International Patent Application No. PCT/US2021/046455, 19 pages.
(Continued)

*Primary Examiner* — Bac H Au
(74) *Attorney, Agent, or Firm* — Perkins Coie LLP

(57) ABSTRACT

Systems and methods for a semiconductor device having a substrate material with a trench at a front side, a conformal dielectric material over at least a portion of the front side of the substrate material and in the trench, a fill dielectric material on the conformal dielectric material in the trench, and a conductive portion formed during front-end-of-line (FEOL) processing. The conductive portion may include an FEOL interconnect via extending through the fill dielectric material and at least a portion of the conformal dielectric material and having a front side portion defining a front side electrical connection extending beyond the front side of the semiconductor substrate material and a backside portion defining an active contact surface. The conductive portion may extend across at least a portion of the conformal dielectric material and the fill dielectric material and have a backside surface defining an active contact surface.

4 Claims, 9 Drawing Sheets

(51) Int. Cl.
 *H01L 21/768* (2006.01)
 *H01L 27/06* (2006.01)
 *H01L 27/092* (2006.01)

(52) U.S. Cl.
 CPC .... *H01L 21/76877* (2013.01); *H01L 23/5386* (2013.01); *H01L 27/0688* (2013.01); *H01L 27/092* (2013.01)

(56) References Cited

U.S. PATENT DOCUMENTS

| | | | |
|---|---|---|---|
| 10,629,616 | B1 | 4/2020 | Kai et al. |
| 10,903,164 | B2 | 1/2021 | Nishida |
| 11,171,097 | B2 * | 11/2021 | Said ............ H01L 25/50 |
| 11,195,857 | B2 | 12/2021 | Kai et al. |
| 11,201,107 | B2 * | 12/2021 | Okina ............ H01L 24/08 |
| 11,322,466 | B2 * | 5/2022 | Okina ............ H01L 23/585 |
| 11,355,486 | B2 | 6/2022 | Mizutani et al. |
| 2007/0032059 | A1 | 2/2007 | Hedler et al. |
| 2011/0031633 | A1 | 2/2011 | Hsu et al. |
| 2011/0089572 | A1 | 4/2011 | Tezcan et al. |
| 2012/0132967 | A1 | 5/2012 | Andry et al. |
| 2012/0153500 | A1 * | 6/2012 | Kim ............ H01L 21/76898 438/653 |
| 2015/0102497 | A1 | 4/2015 | Park et al. |
| 2015/0380339 | A1 | 12/2015 | Zhao et al. |
| 2017/0179026 | A1 * | 6/2017 | Toyama ............ H10B 43/50 |
| 2018/0145030 | A1 | 5/2018 | Beyne et al. |
| 2019/0051599 | A1 * | 2/2019 | Zhang ............ H10B 43/27 |
| 2019/0296041 | A1 * | 9/2019 | Yamasaka ............ H01L 27/0688 |
| 2020/0020684 | A1 * | 1/2020 | Chen ............ H01L 24/33 |
| 2020/0098776 | A1 | 3/2020 | Sugisaki |
| 2020/0258816 | A1 | 8/2020 | Okina et al. |
| 2020/0258904 | A1 * | 8/2020 | Kai ............ H10B 41/41 |
| 2020/0266146 | A1 | 8/2020 | Nishida |
| 2020/0295037 | A1 * | 9/2020 | Iijima ............ H01L 23/5226 |
| 2020/0381384 | A1 * | 12/2020 | Huo ............ H01L 23/5384 |
| 2021/0035965 | A1 * | 2/2021 | Mizutani ............ H01L 25/18 |
| 2021/0327807 | A1 * | 10/2021 | Chen ............ H01L 21/76898 |
| 2022/0068765 | A1 * | 3/2022 | Kirby ............ H01L 24/08 |

OTHER PUBLICATIONS

International Application No. PCT/US2021/046461—International Search Report and Written Opinion, mailed Dec. 10, 2021, 13 pages.

\* cited by examiner

FRONT END OF LINE INTERCONNECT STRUCTURES AND ASSOCIATED SYSTEMS AND METHODS

CROSS-REFERENCE TO RELATED APPLICATION

This application claims the benefit of U.S. Provisional Patent Application No. 63/071,983, filed on Aug. 28, 2020, which is incorporated herein by reference in its entirety.

TECHNICAL FIELD

The present disclosure is generally directed to semiconductor devices, and in several embodiments, more particularly to systems and methods of forming pre-positioned front-end-of-line interconnect structures for backside electrical connections.

BACKGROUND

Microelectronic devices, such as memory devices, microprocessors, and light emitting diodes, typically include one or more semiconductor dies mounted to a substrate and encased in a protective covering. The semiconductor dies include functional features, such as memory cells, processor circuits, interconnecting circuitry, etc. Semiconductor die manufacturers are under increasing pressure to reduce the volume occupied by semiconductor dies while increasing the capacity and/or speed of the resulting encapsulated assemblies. To meet these and other demands, semiconductor die manufacturers often stack multiple semiconductor dies vertically on top of each other to increase the capacity or performance of a microelectronic device within the limited volume on the circuit board or other element to which the semiconductor dies are mounted. In vertical semiconductor die stack assemblies, through-silicon vias (TSV) are often used to make an electrical connection through a die.

The semiconductor device is initially fabricated using front-end-of-line (FEOL) processing in which individual devices (transistors, capacitors, resistors, etc.) are formed at the active side of the semiconductor substrate. In conventional semiconductor device assemblies, back-end-of-line (BEOL) processing of the substrate is used to form various interconnects for backside electrical connections, e.g., through silicon vias, metalization layers, bond pads, etc. Conventional BEOL processing methods for forming interconnects require extensive processing time and complex fabrication operations, and they also have limited design options for routing configurations. BEOL processing generally occurs immediately before a probe stage, where signals are physically acquired from the internal nodes of a semiconductor device for failure analysis and defect detection.

DETAILED DESCRIPTION

Figure 1A:
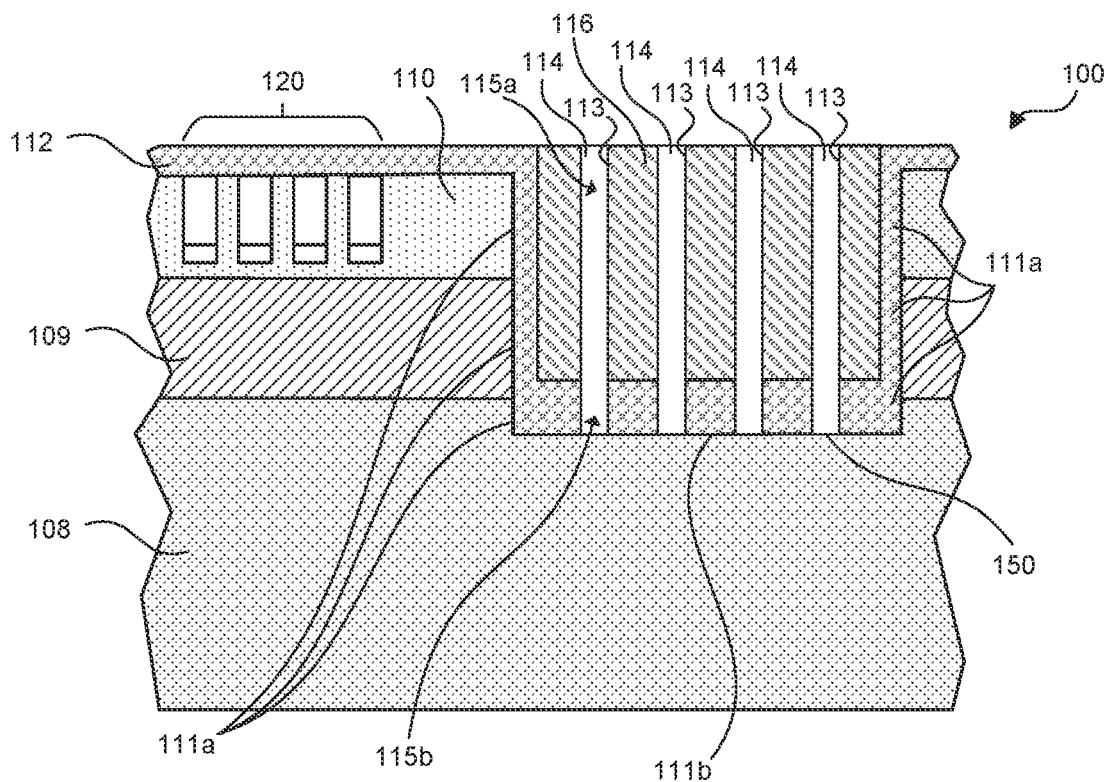
FIGS. 1A-1E are enlarged cross-sectional views showing various stages of fabricating a semiconductor device having a front-end-of-line interconnect structure in accordance with embodiments of the present technology.

The technology disclosed herein relates to semiconductor devices, systems with semiconductor devices, and related methods for manufacturing semiconductor devices. The term "semiconductor device" generally refers to a solid-state device that includes one or more semiconductor materials. Examples of semiconductor devices include logic devices, memory devices, and diodes, among others. Furthermore, the term "semiconductor device" can refer to a finished device or to an assembly or other structure at various stages of processing before becoming a finished device.

Depending upon the context in which it is used, the term "substrate" can refer to a structure that supports electronic components (e.g., a die), such as a wafer-level substrate, a singulated die-level substrate, or another die for die-stacking applications. Suitable steps of the methods described herein can be performed at the wafer-level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, plating, and/or other suitable techniques. Similarly, materials can be removed, for example, using plasma etching, wet etching, chemical-mechanical planarization, or other suitable techniques.

The present technology includes a semiconductor device having an interconnect structure for back side electrical connections embedded (e.g., "pre-positioned") during front-end-of-line (FEOL) processing. FEOL processing is the stage of integrated circuit fabrication in which individual devices (transistors, capacitors, resistors, etc.) are formed at the active side of the semiconductor material. In contrast to the present technology, FEOL processes occur before fabricating metal interconnect structures at the backside. Conventional semiconductor device packages use back-end-of-line (BEOL) processing to form contact pads, through silicon vias, interconnect wires, and/or dielectric structures, among other processes. During BEOL processing, metals and/or dielectric materials are deposited on the wafer to create contacts, insulating materials, metal levels, and/or bonding sites for chip-to-chip and chip-to-package connections. After BEOL processing, a probe stage is performed to physically acquire signals from the internal nodes of a semiconductor device for failure analysis and defect detection. Following the probe stage, post-probe processing is performed, which includes processes on the front side and/or the backside, including, e.g., three-dimensional integration (3DI) processing among other processing.

The present technology is generally directed to forming an interconnect structure during FEOL processing (e.g., gate level processing) at or near the active side of the die and exposing or otherwise accessing the pre-positioned interconnect structure during BEOL or post-probe processing with ultra-thin silicon processing, total silicon removal, and/or patterning. In some embodiments, the present technology eliminates the need for forming BEOL interconnects, allows direct-to-device routing, allows probe testing at an earlier stage of fabrication, and enables ultra-thin die stacking among other advantages over conventional process. In some embodiments, a shallow interconnect area is positioned adjacent to a shallow trench isolation (STI) structure and is formed in or on the substrate during FEOL processing. The FEOL processed interconnect or interconnect area has an active contact surface, or 3Dx contact, that is buried on the backside of the device within silicon and/or dielectric materials during FEOL processing. The active surface of the FEOL interconnect is then revealed for access from the backside during BEOL or post-probe processing.

Various FEOL interconnect configurations are within the scope of the present technology, such as array, sacrificial oxide, etc., or any combination thereof. Processing of three-dimensional integration (3DI) using the present technology is expected to reduce cost and provide a high degree of design flexibility for routing and other structures. For example, backside routing components can be formed during FEOL processing and accessed for electrical connection through the substrate during BEOL or post-probe processing, as will be described below. In contrast, conventional processing requires forming backside routing components by patterning, etching, and filling to create through silicon vias during BEOL processing, which poses various challenges, e.g., etching and filling relatively deep holes, processing without damaging thin layers, etc. In these regards, device connections of the present technology are more directly integrated than conventional device connections. Some embodiments can be applied to bonded microelectronic devices, such as NAND circuits, among others. In these configurations, separate complementary metal-oxide-semiconductor (CMOS) and array chips may be bonded together face-to-face, face-to-back, or back-to-back. During FEOL processing, a FEOL interconnect is pre-positioned in the substrate materials or insulating materials of the array chip and accessed for electrical connection through the backside of the array chip. In some embodiments, the CMOS assembly includes periphery circuit devices that support the array, but generally does not include memory cells and access devices; and the array assembly includes wordlines, bitlines, access devices, and memory cells, but generally does not include periphery circuit devices such as drivers, latches, controllers, regulators, etc.

FIGS. 1A-1E show enlarged cross-sectional views of various stages of fabricating a semiconductor device comprising an array chip assembly 100 ("array assembly 100") in accordance with embodiments of the present technology. The array assembly 100 includes a multi-layer silicon substrate, having a bulk silicon region 108, a first implant region 109, and a second implant region 110, where the regions 108, 109, and 110 are configured to receive various materials and components of the array assembly 100. The array assembly 100 also has a trench region defined by sidewalls 111a extending through at least the first and second implant regions 109 and 110, and in some embodiments the sidewalls 111a extend to a depth at least partially into the bulk silicon region 108 to form a bottom surface 111b. The array assembly further includes a dielectric material 112, a fill material 116, and FEOL conductive interconnect vias 114 in holes 113. The dielectric material 112 can be a conformal structure, e.g., an STI material, that extends over the second implant region 110, along the sidewalls 111a, and over the bottom surface 111b. The fill material 116 can be a dielectric material that fills the trench region.

In the illustrated embodiment, the interconnect vias 114 extend through the fill dielectric material 116 and at least partially through the STI 112. The interconnect vias 114 are formed by etching holes 113 through the fill material 116 and the dielectric material 112 and then depositing a suitable conductive material, such as tungsten, in the holes 113. The interconnect vias 114 have a front portion 115a that extends beyond the front side of the second implant region 110 and a back portion 115b that protrudes at least partially through the STI 112 and is positioned at or in the bulk silicon region 108. In other embodiments, the back portion 115b is partially buried in the STI 112 and does not contact the bulk silicon region 108 during FEOL processing. An FEOL pre-positioned contact 150 ("FEOL contact 150"), such as a 3Dx contact, is located on an end of the back portion 115b of the interconnect 114 and defines an active contact surface.

The array assembly 100 can also include an array structure 120, such a memory array or other active features. The array structure 120 may be electrically coupled to the interconnect vias 114 through one or more circuits (not shown) embedded in materials of the array assembly 100 during FEOL processing. Although one exemplary configuration of the array structure 120 is depicted in FIGS. 1A-1E, any suitable configuration of the array structure 120 or other device structure is also within the scope of the present technology.

Figure 1B:
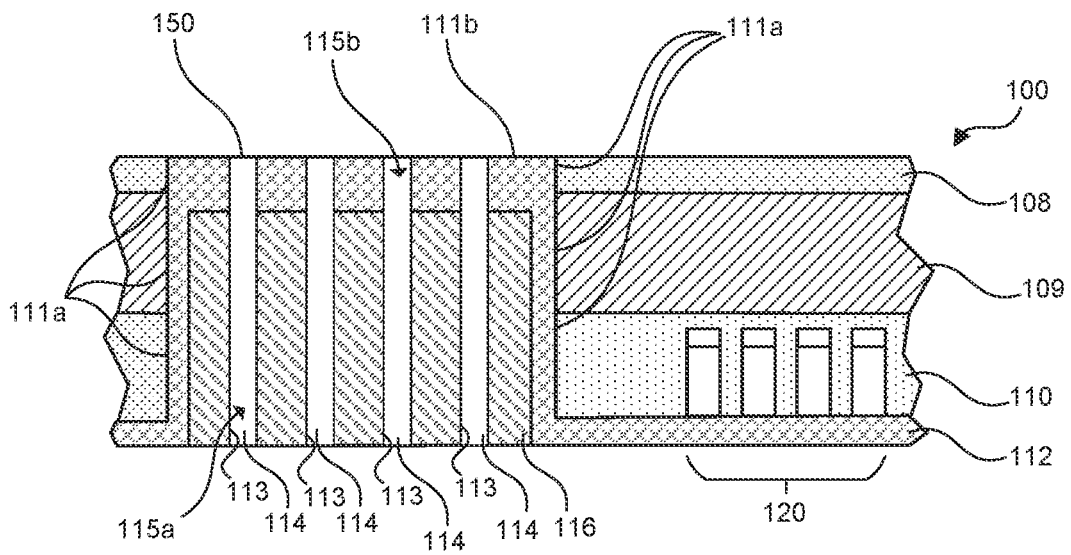
Figure 1C:
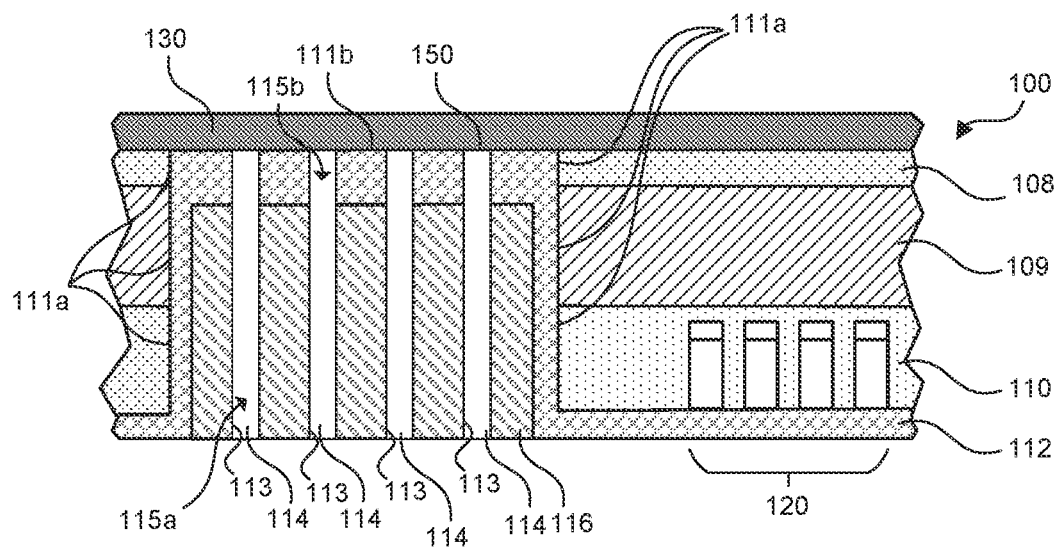
Figure 1D:
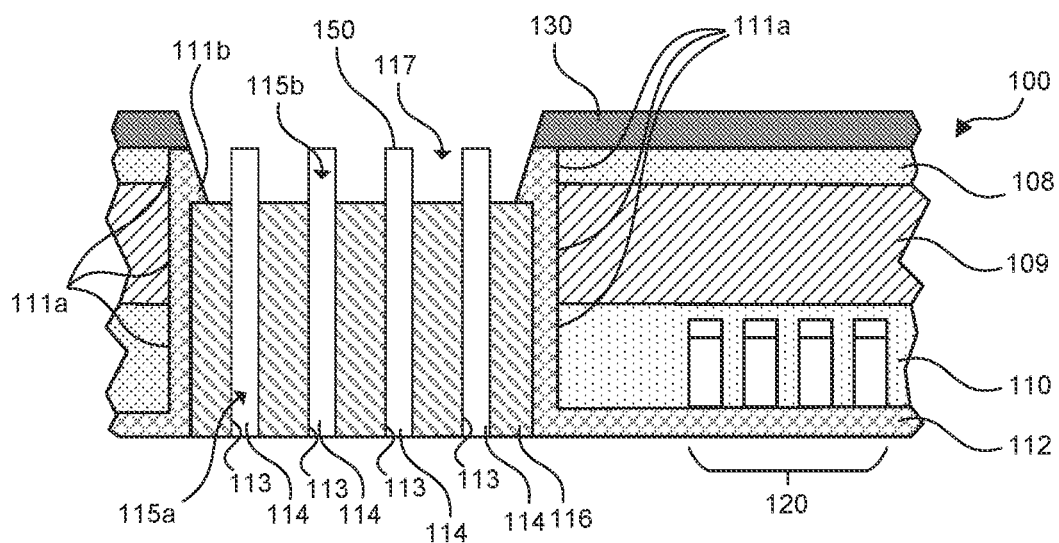

FIG. 1B shows the array assembly 100 in an inverted orientation compared to FIG. 1A after a portion of the bulk silicon region 108 has been removed. Removal of the bulk silicon region 108 may expose the embedded FEOL contact 150 at the backside of the array assembly 100; however, the FEOL contact 150 may remain embedded under silicon or dielectric material until the step shown in FIG. 1D. FIG. 1C shows the array assembly 100 after an additional insulating material 130 has been formed on the thinned bulk silicon region 108, the STI dielectric material 112, and portions of the FEOL contact 150, if exposed. FIG. 1D shows the array assembly after a portion of the insulating material 130, the STI dielectric material 112, and the fill dielectric material 116 have been patterned and etched to form an opening 117 in the trench region that exposes the FEOL contact 150 and a portion of the interconnect vias 114 at the back portion 115b, such that electrical connections can be made.

Figure 1E:
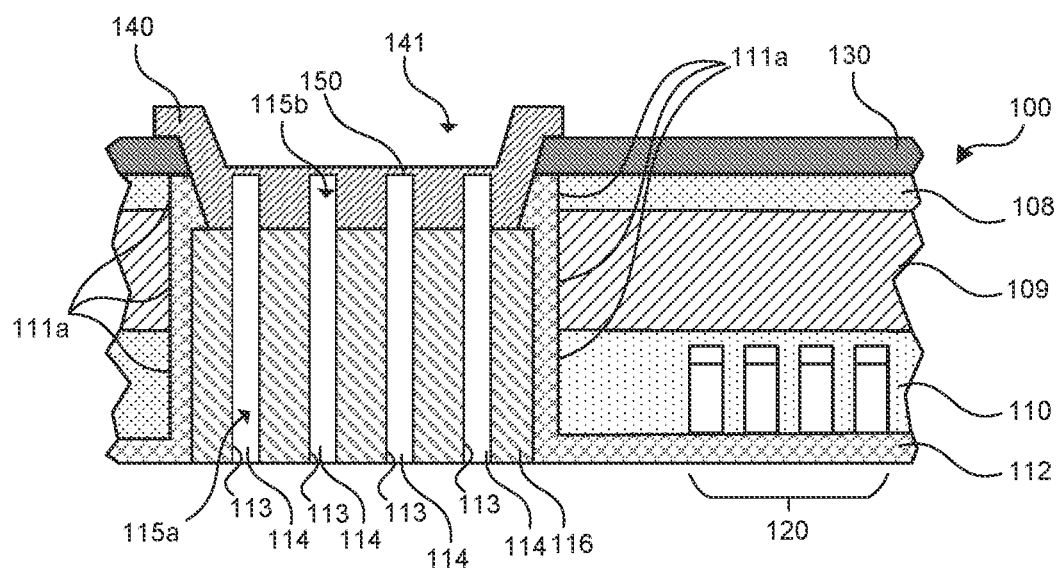

FIG. 1E shows the array assembly after a conductive contact feature 140 has been formed in the opening 117 (FIG. 1D) over the FEOL contact 150. The contact feature 140 can be formed by depositing a conductive material across the back side and then patterning and etching the conductive material to form the contact feature 140 in the opening 117. The contact feature 140 has a concave region 141 configured to receive a solder material therein that can provide a backside electrical connection location for the array assembly 100. The contact feature 140 may further form electrical connections by metal bonding. Although one configuration of an FEOL contact is shown, other configurations are within the scope of the present technology.

Figure 2A:
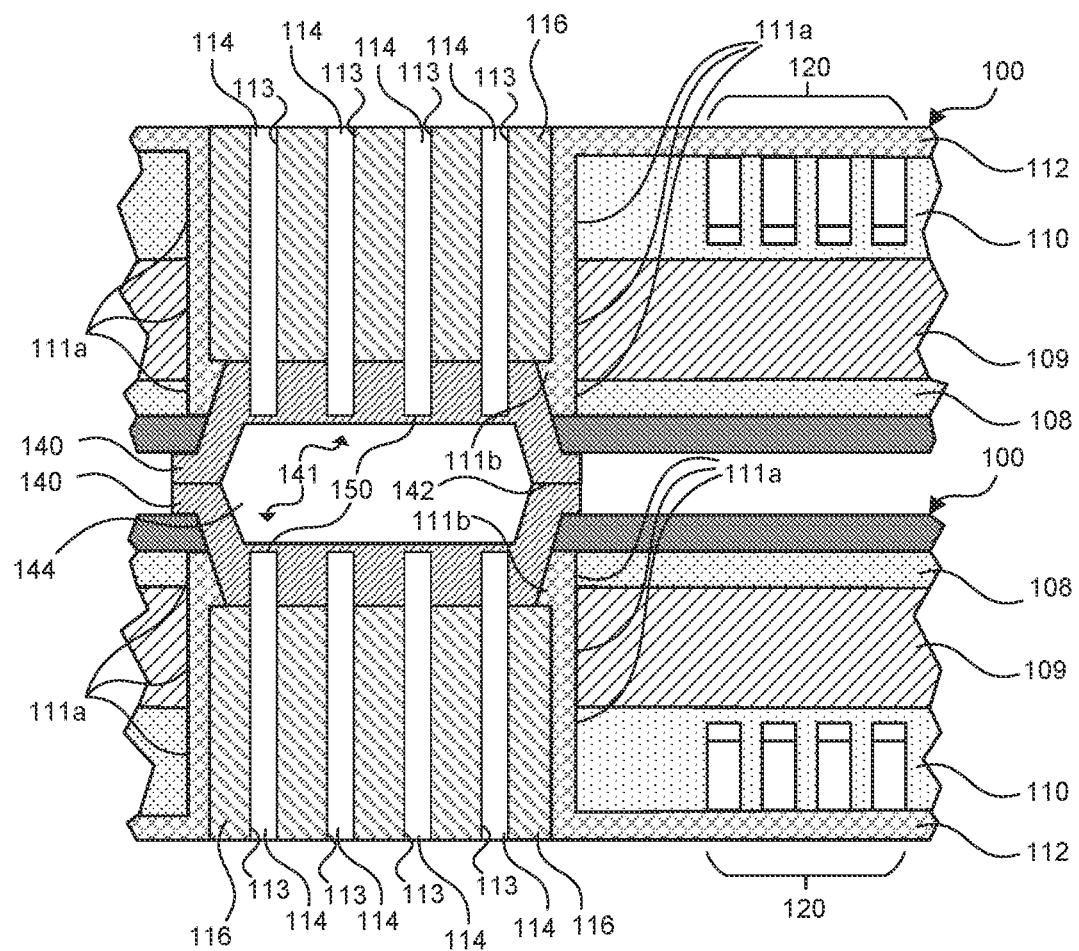
FIGS. 2A and 2B are enlarged cross-sectional views showing embodiments of assembly configurations of the semiconductor devices of FIGS. 1A-1E.
Figure 2B:
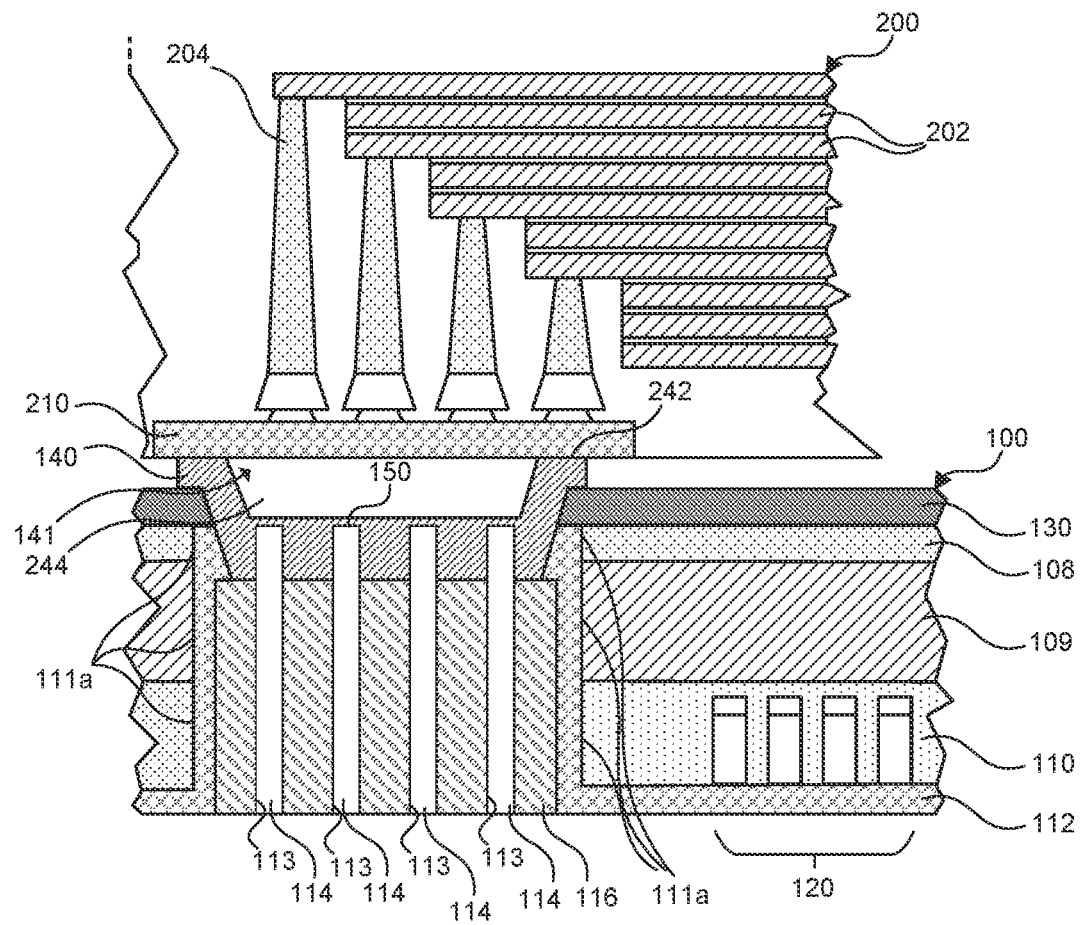

FIGS. 2A and 2B show enlarged cross-sectional views of embodiments of assembly configurations of the array assembly 100 of FIG. 1E. FIG. 2A shows multiple array assemblies 100 arranged in a back-to-back configuration in which the contact features 140 of the individual array assemblies 100 are electrically connected. The array assemblies 100 may be electrically coupled in this configuration by bonding the contact features 140 at a bond line 142 and/or a solder connection 144 within the volume defined by concave regions 141 of the contact features 140.

FIG. 2B shows another configuration in which the array assembly 100 is electrically coupled to a 3D memory array 200 in a back-to-front arrangement. The 3D memory array 200 has a plurality of stacked memory array layers 202 electrically coupled to one or more bond pads 210 by interconnects 204. The contact feature 140 is electrically connected to the bond pad 210 of the stacked memory array assembly 200 at a bond line 242 and/or a solder connection 244 in a volume defined by the concave region 141 of the contact feature 140.

FIGS. 3A-3F show enlarged cross-sectional views of various stages of fabricating a semiconductor device comprising an array chip assembly 300 ("array assembly 300") in accordance with embodiments of the present technology. The array assembly 300 is similar in overall structure and configuration to the array assembly 100 of FIGS. 1A-1E, and like reference numbers refer to similar features in FIGS. 3A-3F, but are in the 300-series, and the features may have variations and/or have different shapes and sizes.

The array assembly 300 includes a multi-region silicon substrate, having a bulk silicon region 308, a first implant region 309, and a second implant region 310, where the regions 308, 309, and 310 are configured to receive various materials and components of the array assembly 300. The array assembly 300 also includes a trench region defined by sidewall 311a and a bottom surface 311b. The sidewalls 311a extend at least through the first and second implant regions 309 and 310, and in some embodiments the sidewalls 311a extend into a portion of the bulk silicon region 308 such the bottom surface 311b of the trench region is within the bulk dielectric region 308. The array assembly 300 further includes a dielectric material 312, e.g., an STI dielectric 312, that conforms to the sidewalls 311a and the bottom surface 311b, and a trench insulating material 316 in the volume of the trench region. The array assembly 300 further includes a conductive interconnect material 314 extending across the trench insulating material 316 and across at least a portion of the STI dielectric 312, and an FEOL array structure 320 (e.g., memory arrays). An FEOL pre-positioned active contact surface 350, such as a 3Dx contact surface, may be positioned on a surface of the interconnect material 314 facing the trench insulating material 316. The interconnect material 314 may be electrically coupled to the FEOL array structure 320 through one or more circuits (not shown) formed during the FEOL process. Although one exemplary configuration of the array structure 320 is depicted in FIGS. 3A-3D, any suitable configuration of an array structure or other device structure is also within the scope of the present technology.

Figure 3A:
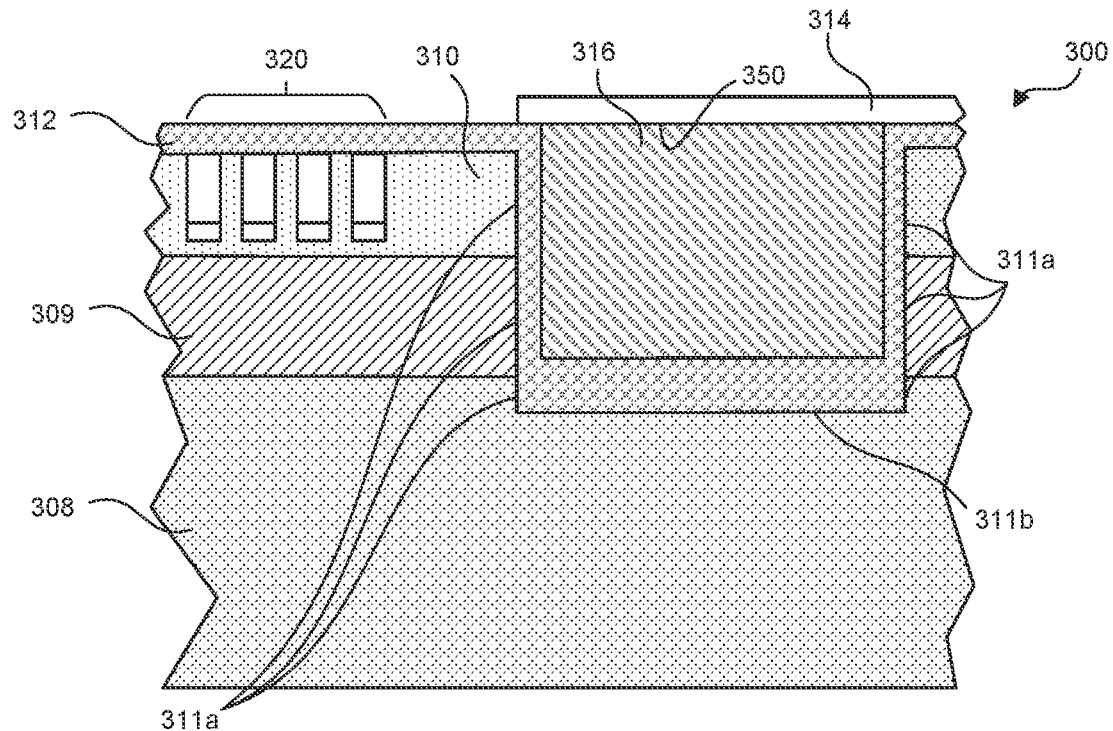
FIGS. 3A-3F are enlarged cross-sectional views of various stages of fabricating semiconductor devices having a front-end-of-line interconnect structure in accordance with embodiments of the present technology.
Figure 3B:
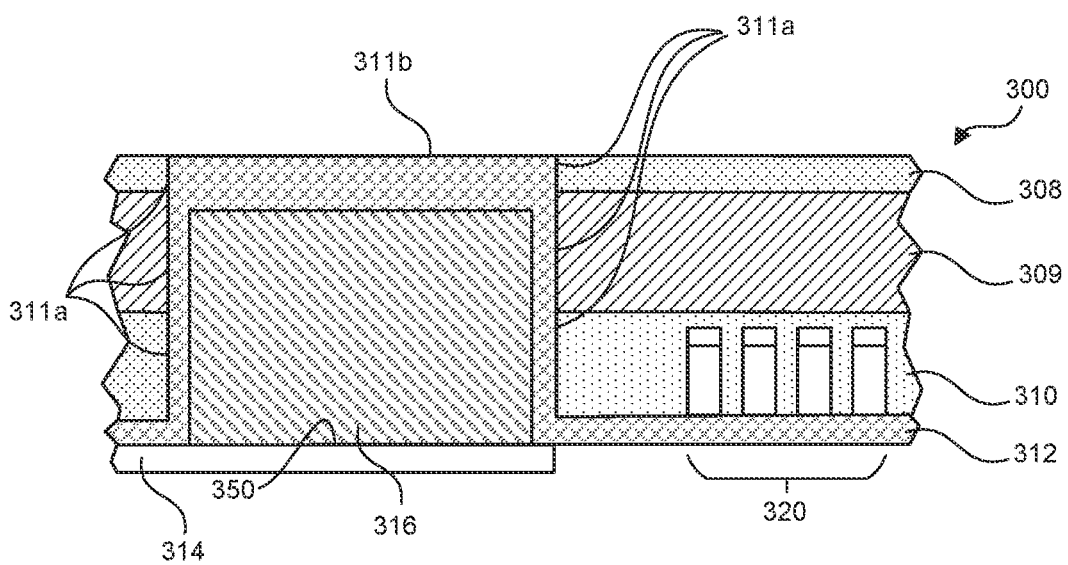
Figure 3C:
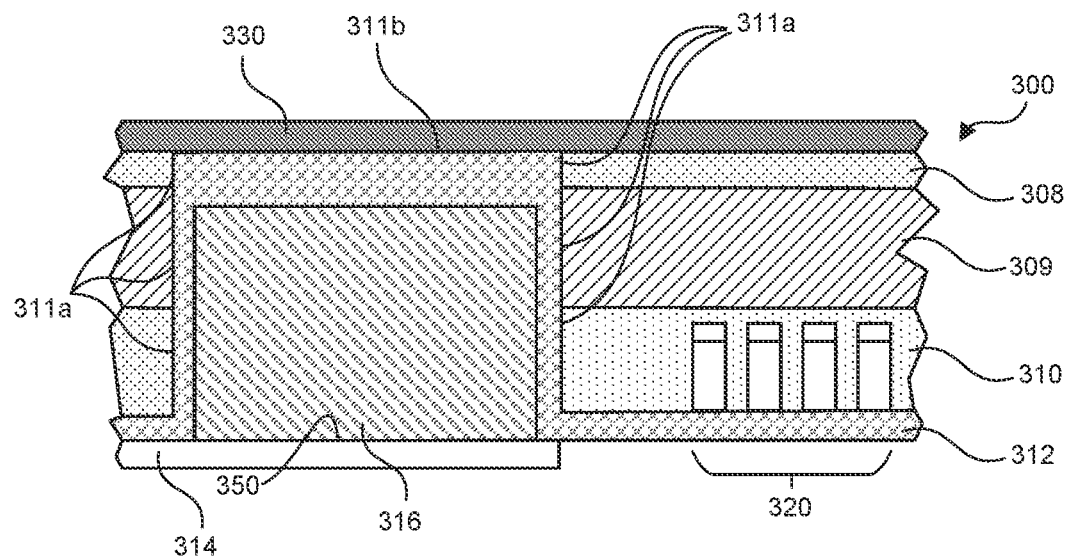
Figure 3D:
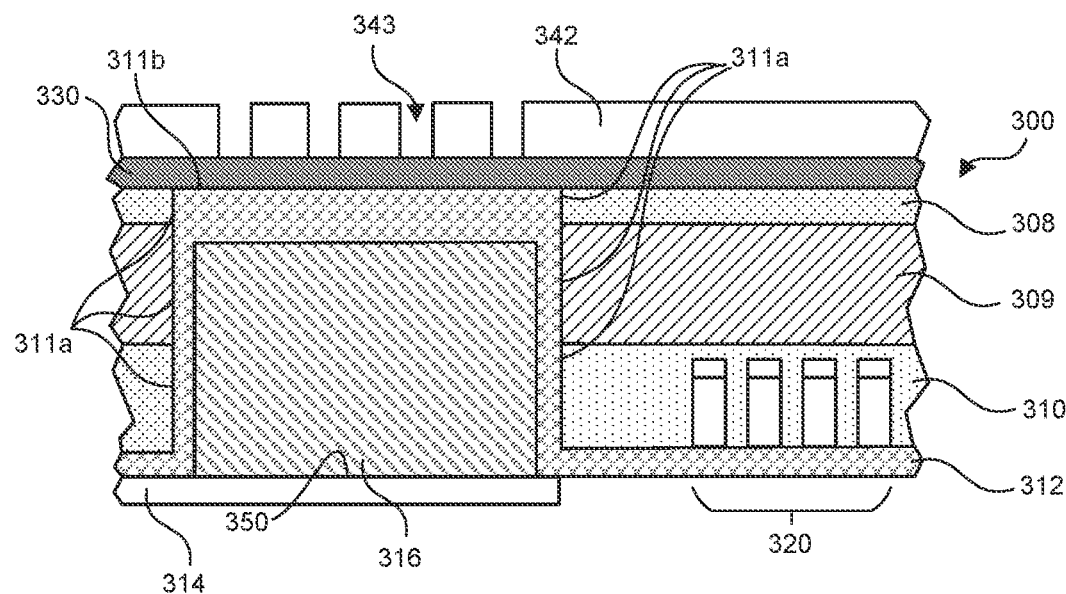
Figure 3E:
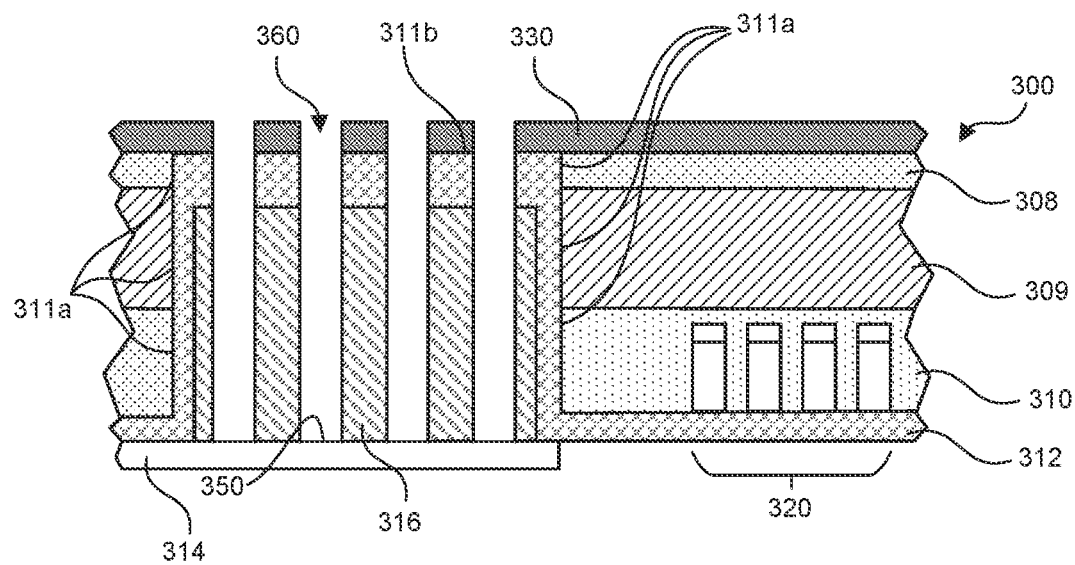

FIG. 3B shows the array assembly 300 in an inverted orientation compared to FIG. 3A and after a portion of the bulk silicon region 308 has been removed to expose at least a portion of the STI dielectric 312 on the backside of the array assembly 300. FIG. 3C shows the array assembly 300 after an additional insulating material 330 has been formed on the remaining bulk silicon region 308 and the STI dielectric 312 using backside passivation or other suitable methods, and FIG. 3D shows the array assembly 300 after a resist material 342 has been applied over the insulating material 330 and openings 343 having been formed in the resist material 342. FIG. 3E shows the array assembly 300 after holes 360 have been formed through the insulating material 330, the STI dielectric 312, and the trench insulating material 316. The holes 360 extend to the conductive interconnect material 314 to expose the FEOL contact surface 350 on the back side of the interconnect material 314 aligned with the opening 343 in the resist material 342 (FIG. 3D).

Figure 3F:
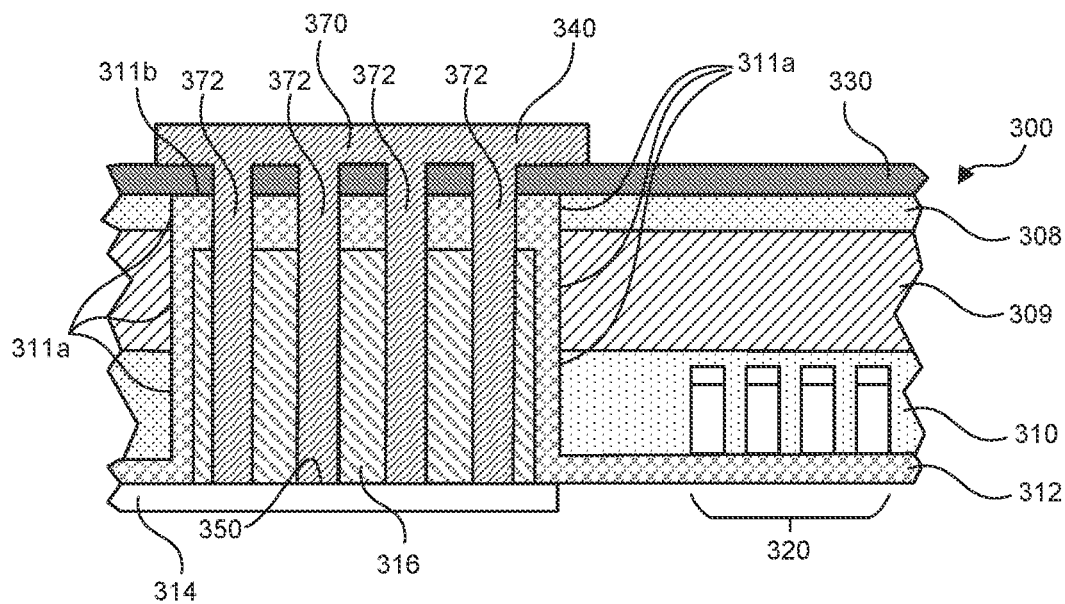

FIG. 3F shows the array assembly 300 after conductive material 370 has been applied to form interconnect vias 372 in the openings 360 and a contact feature 340 at one end of the interconnect vias 372. The interconnect vias 372 electrically couple the contact feature 340 and the FEOL contact surface 350 to provide a backside electrical connection location for the array assembly 300. Although one configuration of an FEOL contact surface is shown, other configurations are within the scope of the present technology. Similar assembly configurations to those shown in FIGS. 2A and 2B are possible with the array assembly 300, among other face-to-face, back-to-face, and back-to-back configurations.

The interconnects described herein may be formed from suitable conductive materials, such as copper (Cu), and may have solder caps to form the electrical connections (e.g., tin-silver (SnAg) solder caps). During assembly, the solder cap can be reflowed using gang reflow, sonic reflow, or other techniques. The bond pads can be copper pads and may be bonded using copper-to-copper bonding or other suitable techniques.

Figure 4:
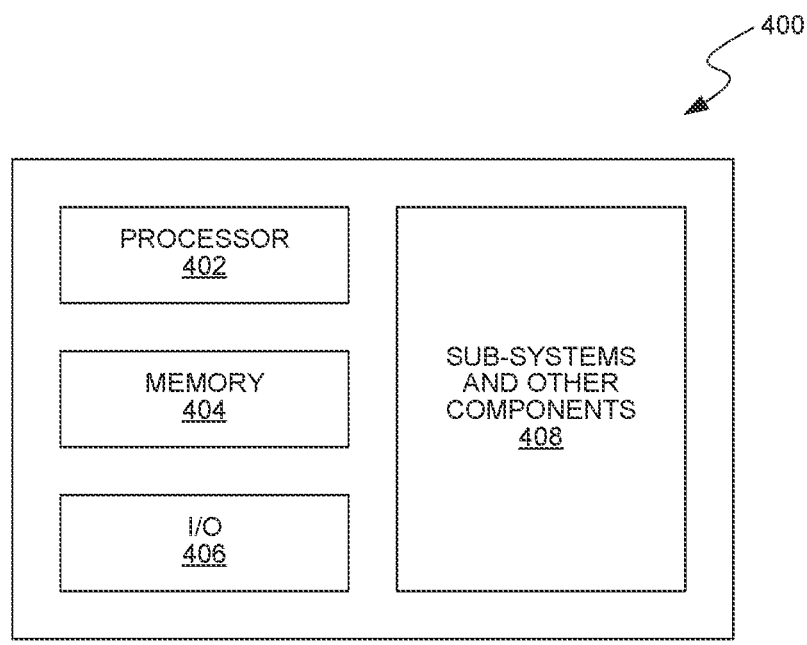
FIG. 4 is a schematic view of a system that includes a semiconductor device in accordance with embodiments of the present technology.

FIG. 4 is a block diagram illustrating a system that incorporates a semiconductor device in accordance with embodiments of the present technology. Any one of the semiconductor devices having the features described above with reference to FIGS. 1A-3F can be incorporated into any of a myriad of larger and/or more complex systems, a representative example of which is system 400 shown schematically in FIG. 4. The system 400 can include a processor 402, a memory 404 (e.g., SRAM, DRAM, flash, and/or other memory devices), input/output devices 406, and/or other subsystems or components 408. The semiconductor assemblies, devices, and device packages described above with reference to FIGS. 1A-3F can be included in any of the elements shown in FIG. 4. The resulting system 400 can be configured to perform any of a wide variety of suitable computing, processing, storage, sensing, imaging, and/or other functions. Accordingly, representative examples of the system 400 include, without limitation, computers and/or other data processors, such as desktop computers, laptop computers, Internet appliances, hand-held devices (e.g., palm-top computers, wearable computers, cellular or mobile phones, personal digital assistants, music players, etc.), tablets, multi-processor systems, processor-based or programmable consumer electronics, network computers, and minicomputers. Additional representative examples of the system 400 include lights, cameras, vehicles, etc. In these and other examples, the system 400 can be housed in a single unit or distributed over multiple interconnected units, e.g., through a communication network. The components of the system 400 can accordingly include local and/or remote memory storage devices and any of a wide variety of suitable computer-readable media.

As used in the foregoing description, the terms "vertical," "lateral," "upper," and "lower" can refer to relative directions or positions of features in the semiconductor devices in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, left/right, and distal/proximate can be interchanged depending on the orientation. Moreover, for ease of reference, identical reference numbers are used to identify similar or analogous components or features throughout this disclosure, but the use of the same reference number does not imply that the features should be construed to be identical. Indeed, in many examples described herein, identically numbered features have a plurality of embodiments that are distinct in structure and/or function from each other. Furthermore, the same shading may be used to indicate materials in cross section that can be compositionally similar, but the use of the same shading does not imply that the materials should be construed to be identical unless specifically noted herein.

The foregoing disclosure may also reference quantities and numbers. Unless specifically stated, such quantities and numbers are not to be considered restrictive, but exemplary of the possible quantities or numbers associated with the new technology. Also, in this regard, the present disclosure may use the term "plurality" to reference a quantity or number. In this regard, the term "plurality" is meant to be any number that is more than one, for example, two, three, four, five, etc. For the purposes of the present disclosure, the phrase "at least one of A, B, and C," for example, means (A), (B), (C), (A and B), (A and C), (B and C), or (A, B, and C), including all further possible permutations when greater than three elements are listed.

From the foregoing, it will be appreciated that specific embodiments of the new technology have been described herein for purposes of illustration, but that various modifications may be made without deviating from the present disclosure. Accordingly, the invention is not limited except as by the appended claims. Furthermore, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the present disclosure. Accordingly, the present disclosure and associated technology can encompass other embodiments not expressly shown or described herein.

We claim:

1. A semiconductor device, comprising:
   a substrate material comprising silicon, the substrate material having a front side, a backside, and a trench at the front side;
   active electrical components at the front side of the substrate material on either side of the trench;
   a conformal dielectric material over at least a portion of the front side of the substrate material and in the trench;
   a fill dielectric material on the conformal dielectric material in the trench;
   a plurality of conductive FEOL interconnect vias disposed in the trench and extending through the fill dielectric material and at least a portion of the conformal dielectric material, each interconnect via having a front side portion defining a front side electrical connection extending beyond the front side of the substrate material and a backside portion defining an active contact surface; and
   a contact feature in direct contact with the backside portion of each of the plurality of interconnect vias, the contact feature extending at least partially through the substrate material such that the contact feature is at least partially laterally surrounded by a portion of the substrate material.

2. The semiconductor device of claim 1, wherein the contact feature has a concave region configured to receive a solder material therein.

3. The semiconductor device of claim 1, further comprising array layers defining a memory array, wherein the memory array is electrically coupled to the contact feature through the interconnect vias.

4. The semiconductor device of claim 1, wherein:
   the semiconductor device is a first semiconductor device electrically coupled to a second semiconductor device through the contact feature; and
   the second semiconductor device is an array chip assembly or a CMOS chip assembly.

* * * * *